(12) United States Patent
Pendse et al.

(10) Patent No.: US 6,765,275 B1
(45) Date of Patent: Jul. 20, 2004

(54) TWO-LAYER ELECTRICAL SUBSTRATE FOR OPTICAL DEVICES

(75) Inventors: Neeraj Anil Pendse, Mountain View, CA (US); Jia Liu, San Jose, CA (US); Jitendra Mohan, Santa Clara, CA (US); Bruce Carlton Roberts, San Jose, CA (US); Luu Thanh Nguyen, Sunnyvale, CA (US); William Paul Mazotti, San Martin, CA (US)

(73) Assignee: National Semiconductor Corporation, Santa Clara, CA (US)

( * ) Notice: Subject to any disclaimer, the term of this patent is extended or adjusted under 35 U.S.C. 154(b) by 0 days.

(21) Appl. No.: 10/290,481

(22) Filed: Nov. 6, 2002

Related U.S. Application Data

(63) Continuation-in-part of application No. 10/165,553, filed on Jun. 6, 2002, and a continuation-in-part of application No. 09/568,558, filed on May 9, 2000.
(60) Provisional application No. 60/331,339, filed on Aug. 3, 2001.

(51) Int. Cl.$^7$ ...................... H01L 31/0203; H01L 27/10
(52) U.S. Cl. ........................... 257/433; 257/81; 257/98; 257/99; 257/691; 385/89; 385/14; 385/131
(58) Field of Search .................................. 257/208, 700, 257/691, 781, 695, 698, 774, 433, 81, 80, 82, 98, 99, 100, 431, 432, 434, 435; 385/89, 14, 129, 130, 137, 132, 131, 1, 4, 29, 88

(56) References Cited

U.S. PATENT DOCUMENTS

| | | | |
|---|---|---|---|
| 5,019,673 A | | 5/1991 | Juskey et al. |
| 5,139,969 A | | 8/1992 | Mori |
| 5,352,926 A | | 10/1994 | Andrews |
| 5,579,208 A | | 11/1996 | Honda et al. |
| 5,608,262 A | | 3/1997 | Degani et al. |
| 5,723,369 A | | 3/1998 | Barber |
| 5,726,079 A | | 3/1998 | Johnson |
| 5,790,384 A | | 8/1998 | Ahmad et al. |
| 5,798,567 A | | 8/1998 | Kelly et al. |
| 5,949,135 A | | 9/1999 | Washida et al. |
| 6,043,430 A | | 3/2000 | Chun |
| 6,081,026 A | * | 6/2000 | Wang et al. |
| 6,087,713 A | * | 7/2000 | Haruta |
| 6,236,109 B1 | | 5/2001 | Hsuan et al. |
| 6,258,630 B1 | | 7/2001 | Kawahara |
| 6,316,837 B1 | | 11/2001 | Song |
| 6,316,838 B1 | | 11/2001 | Ozawa et al. |
| 2001/0013645 A1 | | 8/2001 | King et al. |

FOREIGN PATENT DOCUMENTS

| | | |
|---|---|---|
| JP | 60-202956 | 10/1985 |
| JP | 08-125066 | 5/1996 |

OTHER PUBLICATIONS

S. Savastiouk, PH.D., et al. "3–D stacked wafer–level packaging", Mar. 2000, *Advanced Packaging, pp.28–34*.
National Semiconductor, "Packaging Databook", *1993 National Semiconductor*, pp. v–xi to 1–3 to 1–4, 3–1 to 3–20, 3–30 to 3–31, 3–62 to 3–69. Please note: The year of publication is sufficiently earlier than the effective U.S. filing date so that the particular month of publication is not in issue.

* cited by examiner

*Primary Examiner*—Long Pham
*Assistant Examiner*—Dilinh Nguyen
(74) *Attorney, Agent, or Firm*—Beyer Weaver & Thomas, LLP

(57) ABSTRACT

A high performance and small-scale circuitry substrate is described. The circuitry substrate includes a dielectric layer, a return plane attached to a bottom surface of the dielectric layer, and a plurality of return paths (ground) and signal lines that are attached to a top surface of the dielectric layer. The return paths on the top surface are connected to the return plane on the bottom surface by wrapping around at least one edge of the dielectric material. Return paths on the top layer can also separate each pair or adjacent signal lines. The circuitry substrate can be advantageously used to form an optoelectronic module.

18 Claims, 6 Drawing Sheets

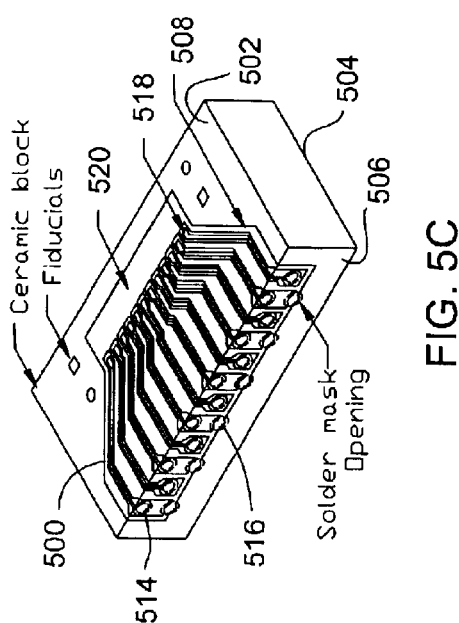
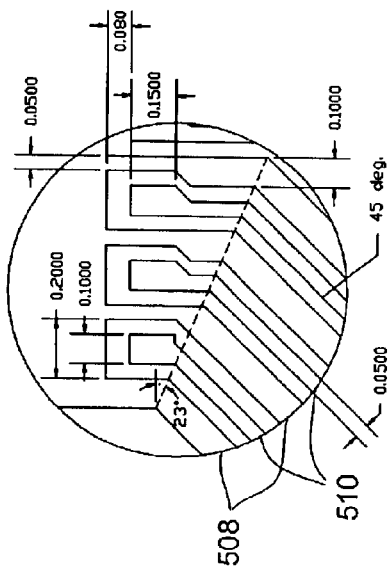
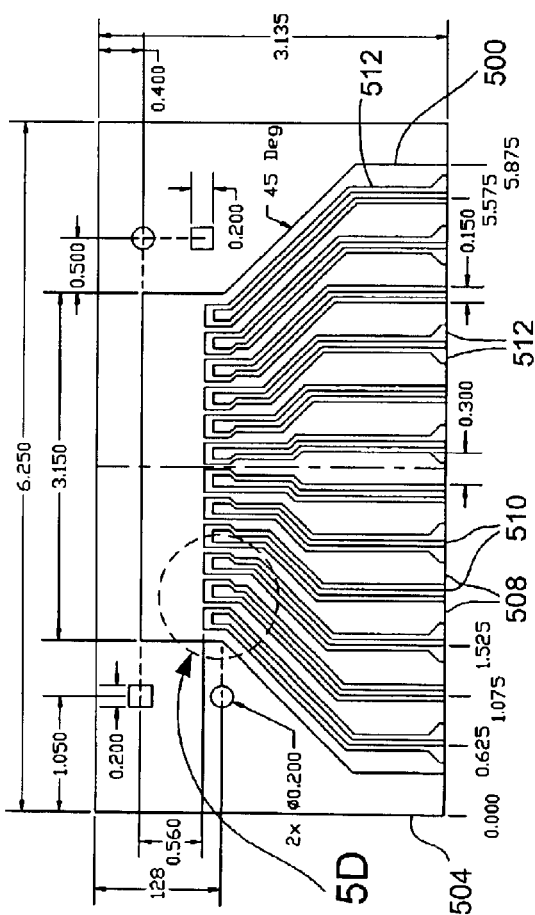
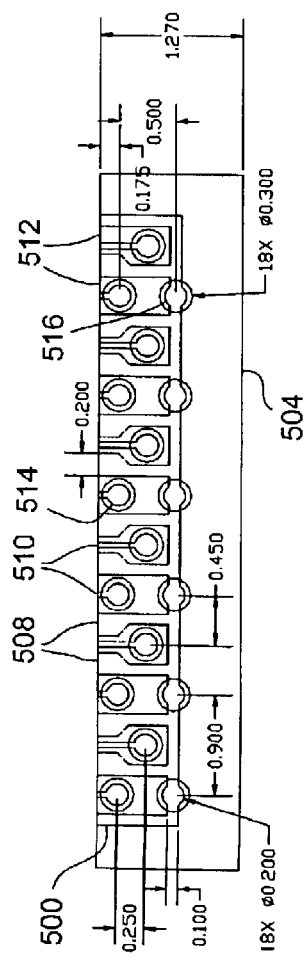
FIG. 5C
FIG. 5D
FIG. 5A
FIG. 5D
FIG. 5B

TWO-LAYER ELECTRICAL SUBSTRATE FOR OPTICAL DEVICES

CROSS-REFERENCE TO RELATED PATENTS AND APPLICATIONS

This application is a continuation-in-part of U.S. patent application Ser. No. 09/568,558, entitled "ARRAYABLE, SCALABLE AND STACKABLE MOLDED PACKAGE CONFIGURATION," filed on May 9, 2000, and of U.S. patent application Ser. No. 10/165,553, entitled "Optical Sub-Assembly for Optotelectronic Modules," filed on Jun. 6, 2002, which claims priority from U.S. Provisional Application No. 60/331,339, filed on Aug. 3, 2001, the content of each of which are hereby incorporated by reference.

This application is related to U.S. Pat. No. 6,364,542, entitled "DEVICE AND METHOD FOR PROVIDING A TRUE SEMICONDUCTOR DIE TO EXTERNAL FIBER OPTIC CABLE CONNECTION," filed on May 9, 2000, to U.S. patent application Ser. No. 09/713,367, entitled "MINIATURE OPTO-ELECTRIC TRANSCEIVER," filed on Nov. 14, 2000, to U.S. patent application Ser. No. 09/922,358, entitled "MINIATURE SEMICONDUCTOR PACKAGE FOR OPTO-ELECTRONIC DEVICES," filed on Aug. 3, 2001, and to U.S. patent application Ser. No. 09/947,210, entitled "TECHNIQUES FOR JOINING AN OPTO-ELECTRONIC MODULE TO A SEMICONDUCTOR PACKAGE," filed on Aug. 3, 2001, the content of each of which are hereby incorporated by reference.

This application is also related to U.S. patent application Ser. No. 10/165/711, entitled "CERAMIC OPTICAL SUB-ASSEMBLY FOR OPTO-ELECTRONIC MODULES," on Jun. 6, 2002, which is a continuation-in-part of U.S. patent application Ser. No. 10/165,553, the content of which is hereby incorporated by reference.

FIELD OF THE INVENTION

The present invention relates generally to optoelectronic devices, and more specifically to techniques for connecting the optical and electrical device components.

BACKGROUND OF THE INVENTION

Many computer and communication networks being built today, including the Internet, are using fiber optic cabling instead of copper wire. With fiber optic cabling, data is transmitted using light signals, not electrical signals. For example, a logical one may be represented by a light pulse of a specific duration and a logical zero may be represented by the absence of a light pulse for the same duration. The bandwidth of optical fiber is significantly greater than copper since light is attenuated less in fiber than electrons traveling through copper.

While fiber optic cabling is very efficient for transferring data, the use of light signals to process data is still very difficult. For instance, currently there is no efficient way to "store" light signals representative of data. Networks therefore use fiber optics for transmitting data between nodes and silicon chips to process the data within computer nodes. This is accomplished by using fiber optic transceivers, which convert light signals from a fiber optic cable into electrical signals, and vice versa. FIG. 1 illustrates a perspective view of an exemplary optoelectronic module 100 that can be used to form an optical transceiver.

Optoelectronic module 100 includes a semiconductor chip subassembly (CSA) 102 and an optical subassembly (OSA) 104. CSA 102 is a packaged semiconductor device. As shown in FIG. 1, CSA 102 is a rectangular block of molding material 106 that has electrical contacts 108 exposed through its bottom and side surfaces. Within the block of molding material 106 is an encapsulated semiconductor die that is electrically connected to contacts 108. For instance, wire bonds can be used for such connections. Another aspect of CSA 102 that cannot be seen is the up-linking contacts on the top surface of CSA 102. These up-linking contacts are also electrically connected to the encapsulated semiconductor die and therefore provide the electrical communication between the semiconductor die and OSA 104. The specific CSA 102 that is shown is a leadless leadframe semiconductor package (LLP). However, it should be understood that CSA 102 can be formed of various types of molded packages.

OSA 104 is formed of a backing block 110, a circuitry substrate 112, and photonic devices 114. Backing block 110 has a front surface 116 that supports circuitry substrate 112 and photonic devices 114, which are attached to circuitry substrate 112. The backing block 120 can be formed of a variety of materials such as a ceramic material, polyethylene ether ketone (PEEK), or liquid crystal polymer (LCP).

Circuitry substrate 112 is attached to front surface 116 of backing block 110, wraps around the bottom-front corner of backing block 110, and covers most of the bottom surface of backing block 110. Embedded traces within circuitry substrate 112 run from photonic devices 114 on the front surface to the bottom surface of backing block 110 where they make contact with the up-linking contacts of CSA 102. Typically, size dimensions involved with circuitry substrate 112 are very small and cause the circuit traces to be positioned very close to each other. The small size is advantageous in the same way that small sizes for most electronic devices is advantageous. However, the close proximity of the traces cause the problem of "cross-talk," especially at high operational frequencies. Cross-talk is the electrical interference between two or more electrically conducting elements. Such cross-talk can drastically reduce the performance of optoelectronic device 100.

In view of the foregoing, an efficient technique for connecting the photonic devices of an optical device to a semiconductor chip device that exhibits low levels of cross-talk would be desirable.

BRIEF SUMMARY OF THE INVENTION

The present invention is directed to a high performance and small-scale circuitry substrate. The circuitry substrate includes a dielectric layer, a ground layer (also referred to as a return plane) attached to a bottom surface of the dielectric layer, and a plurality of return paths (ground) and signal lines that are attached to a top surface of the dielectric layer. The return paths on the top surface are connected to the return plane on the bottom surface by wrapping around at least one edge of the dielectric material. The configuration of the circuitry substrate is designed so that cross-talk is reduced, low levels of ground-bounce and electrical parasitics are exhibited, and optimal impedance levels are obtained. The circuitry substrate can be advantageously used to form an optoelectronic module.

As an apparatus, one embodiment of the present invention includes at least a conductive return plane having a device attachment area, a dielectric layer having a top and a bottom surface, the bottom surface being attached to the return plane, a plurality of signal traces formed on the top surface of the dielectric layer, and a plurality of return paths formed on the top surface of the dielectric layer, each of the return paths wrapping around at least one edge of the dielectric layer and making contact with the return plane. In an alternative embodiment of the apparatus, the return paths wrap around either a top edge, a back edge, or both of the edges in order to make contact with the return plane. In another embodiment of the apparatus, at least one return path extends between each adjacent pair of signal traces, whereby the return paths electrically shield each adjacent pair of signal traces from each other. In yet another embodiment of the invention, the distance between at least two of the signal lines increases as the signal lines extend away from device attachment area. The apparatus of the present invention can be used to connect a photonic device to a semiconductor chip device in order to form an optoelectronic device.

These and other features and advantages of the present invention will be presented in more detail in the following specification of the invention and the accompanying figures, which illustrate by way of example the principles of the invention.

BRIEF DESCRIPTION OF THE DRAWINGS

The invention, together with further advantages thereof, may best be understood by reference to the following description taken in conjunction with the accompanying drawings in which:

FIGS. 5A–D illustrate one embodiment of a circuitry substrate with size dimension markings according to one embodiment of the present invention.

DETAILED DESCRIPTION OF THE INVENTION

The present invention will now be described in detail with reference to a few preferred embodiments thereof as illustrated in the accompanying drawings. In the following description, numerous specific details are set forth in order to provide a thorough understanding of the present invention. It will be apparent, however, to one skilled in the art, that the present invention may be practiced without some or all of these specific details. In other instances, well known operations have not been described in detail so not to unnecessarily obscure the present invention.

The present invention pertains to a high performance and small-scale circuitry substrate. The circuitry substrate includes a dielectric layer, a return plane attached to a bottom surface of the dielectric layer, and a plurality of return paths (ground) and signal lines that are attached to a top surface of the dielectric layer. The return paths on the top surface are connected to the return plane on the bottom surface by wrapping around at least one edge of the dielectric material. The configuration of the circuitry substrate is designed so that cross-talk is reduced, low levels of ground-bounce and parasitics are exhibited, and optimal impedance levels are obtained. The circuitry substrate can be advantageously used to form an optoelectronic module.

Figure 2A:
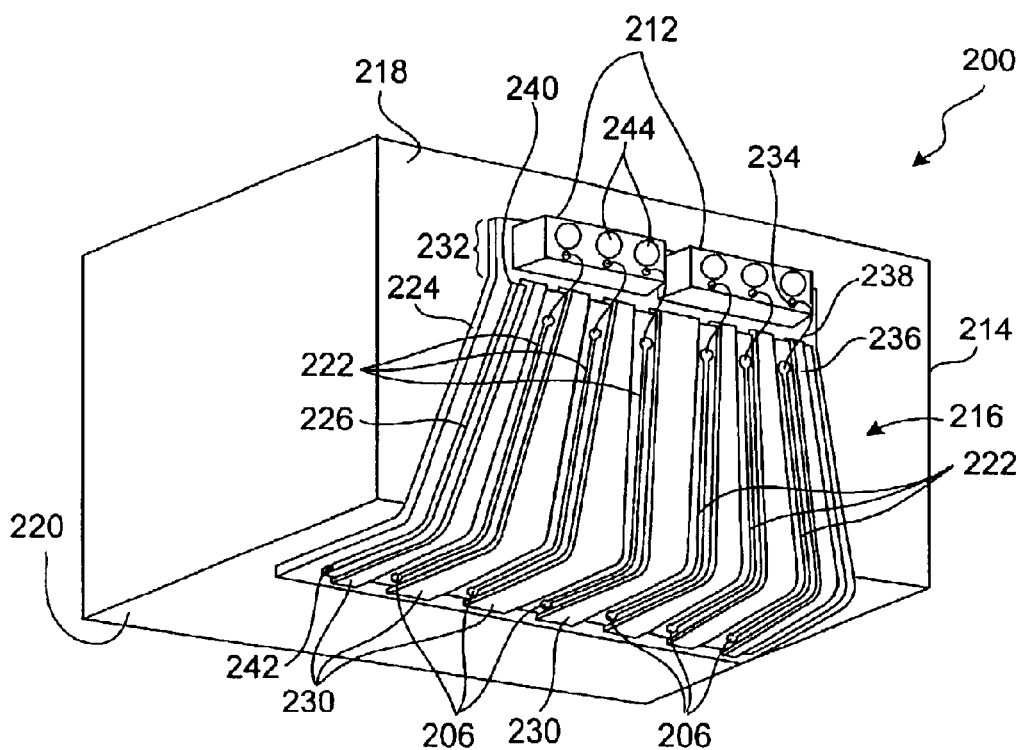
FIGS. 2A and 2B illustrates a perspective view of a simplified optical subassembly and a chip subassembly, according to one embodiment of the present invention.
Figure 2B:
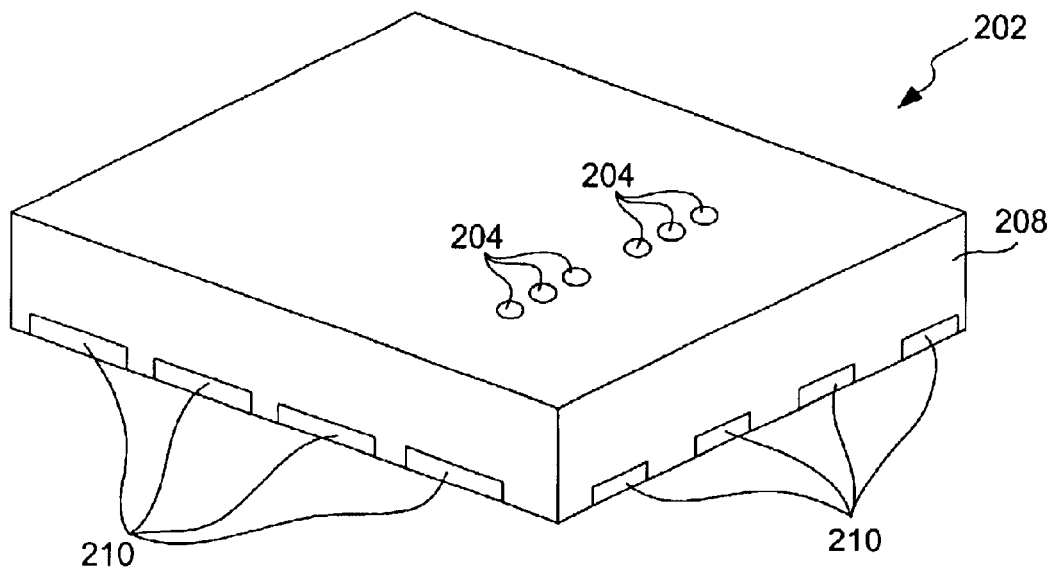

The circuitry substrate can be used to connect various types of electrical systems. The advantages of the substrate are more fully evident when connecting electrical systems at a small dimensional scale. For instance, the circuitry substrate can be used to connect an optical device to a semiconductor chip device in an optoelectronic module. FIG. 2 will now be described to explain such a use of the circuitry substrate.

FIG. 2 illustrates a perspective view of a simplified optical subassembly (OSA) 200 and a chip subassembly (CSA) 202, according to one embodiment of the present invention. OSA 200 and CSA 202 can be combined to form an optoelectronic module. OSA 200 and CSA 202 are placed in electrical connection with each other by connecting the up-linking contacts 204 on the top surface of CSA 202 with the contact pads 206 on the bottom surface of OSA 200. These connections can be facilitated by the use of conductive materials such as solder paste or conductive epoxy, just to name a couple.

Figure 1:
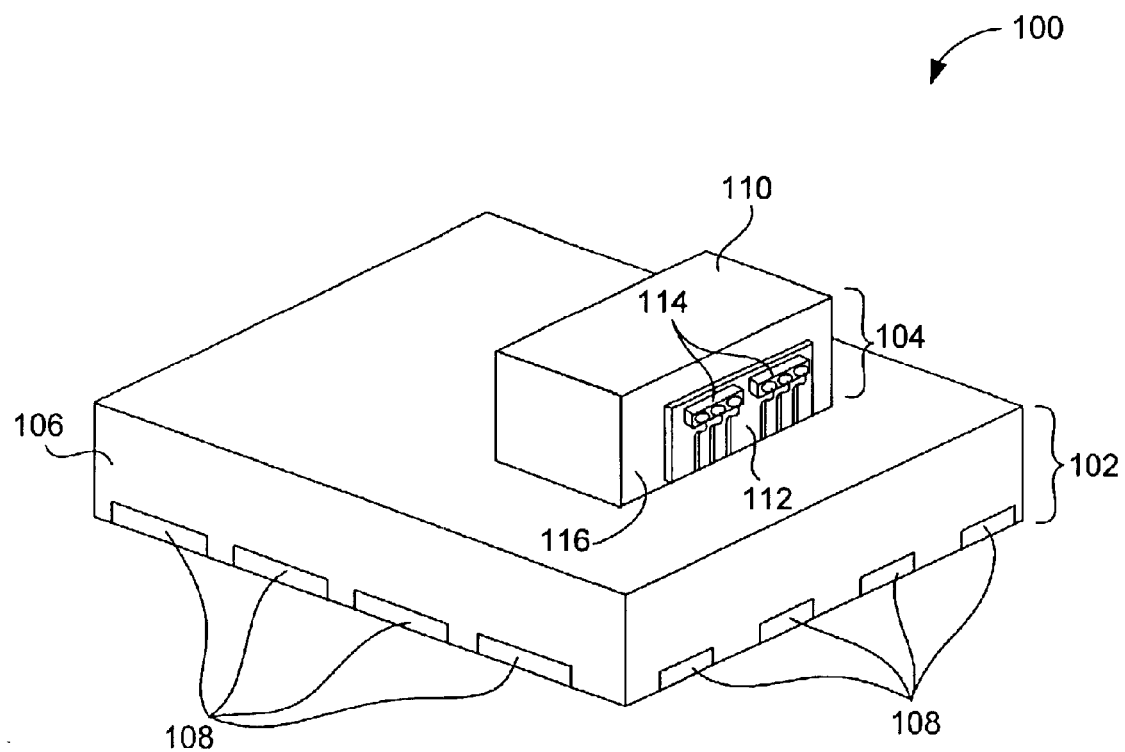
FIG. 1 illustrates a perspective view of an exemplary optoelectronic module that can be used to form an optical transceiver.

As described in FIG. 1, CSA 202 is a packaged semiconductor device in which a semiconductor die (not shown) is encapsulated within a molding material 208 and electrically connected to up-linking contacts 204 and electrical contacts 210. Up-linking contacts 204 provide the path for electrical communication between the semiconductor die with the photonic devices 212 of OSA 200.

OSA 200 includes a backing block 214 that supports a circuitry substrate 216. Circuitry substrate 216 is attached to a front surface 218 and a bottom surface 220 of backing block 214. Photonic devices 212 are attached to circuitry substrate 216 on front surface 218 of backing block 214. Signal lines 222 that run along circuitry substrate 216 connect photonic devices 212 to contact pads 206 on bottom surface 220 so that photonic devices 212 can ultimately be connected to the semiconductor die within CSA 202.

Figure 3A:
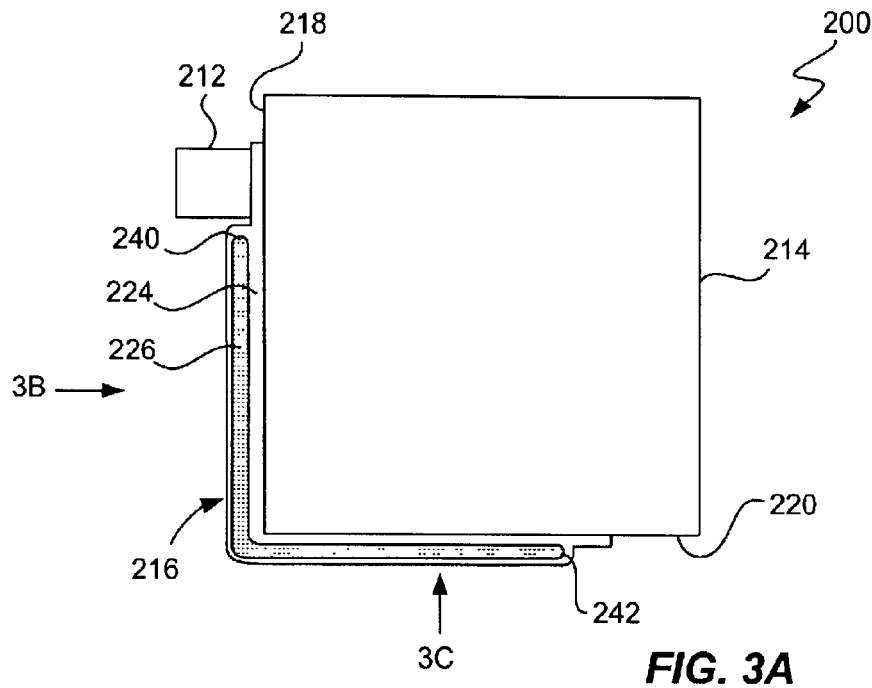
FIGS. 3A–C illustrate a circuitry substrate in a side plan view, a front plan view that looks onto a front surface of a backing block, and a bottom plan view that looks onto a bottom surface of a backing block, respectively.
Figure 3B:
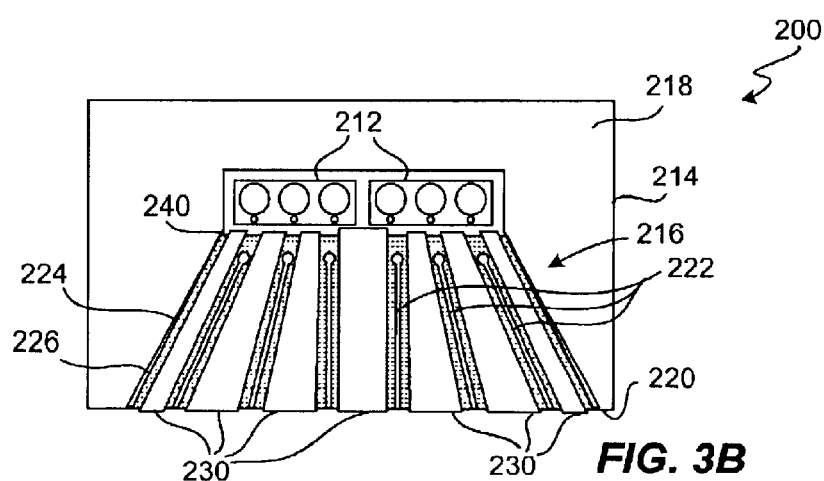
Figure 3C:
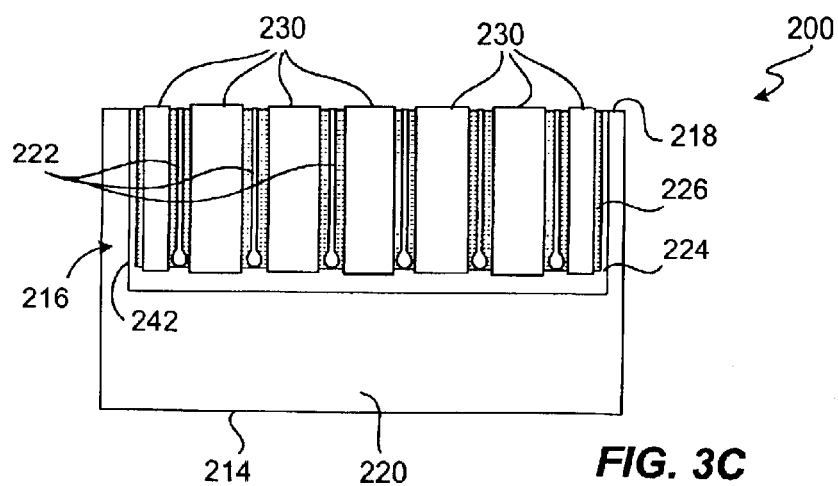

To illustrate the structure and features of circuitry substrate 216, discussion of circuitry substrate 216 will be made with reference to FIGS. 2 and 3A–C. While FIG. 2 shows circuitry substrate 216 is shown in a perspective view, FIGS. 3A–C illustrate circuitry substrate 216 in a side plan view, a front plan view that looks onto front surface 218 of backing block 214, and a bottom plan view that looks onto bottom surface 220 of backing block 214, respectively.

Circuitry substrate 216 is made up of a return plane 224, which is attached to front surface 218 and bottom surface 220 of backing block 214. Return plane 224 can be attached to backing block 214 by using an adhesive material such as epoxy. Various adhesives and other well known methods for forming a conducting metal layer(s) on a circuitry substrates can also be used. A dielectric layer of material 226 is formed on top of return plane 224. On top of dielectric layer 226 is formed a plurality of signal lines 222 and a plurality of return paths (ground) 230. The various layers of circuitry substrate 216 conform to the surface of backing block 214. Photonic devices 212 are mounted onto return plane 224 in a region called the cathode pad 232. Anode contact points 234 on photonic devices 212 are connected to anode contact pads 236, which are formed at the end of signal lines 222, with interconnecting wires 238.

Return plane 224 is formed of a conductive material and is generally solid and flat. In alternative embodiments, it is possible to form return plane 224 with apertures and to have varying thicknesses. Dielectric layer 226 is made of a non-conductive material such as polyimide. Any other material(s) with suitable insulating properties and good mechanical properties to form a reliable structure can be used for form dielectric layer 226. While one surface of dielectric layer 226 is attached to return plane 224, the opposite surface is attached to signal lines 222 and return paths 230.

Return paths 230 serve as additional ground paths. Return paths 230 are formed in between each of signal lines 222 and therefore serve to shield each of signal lines 222 from adjacent signal lines 222. This tends to minimize cross-talk interference between signal lines 222. Varying the widths and spacings of the coplanar ground paths also allows more control over the "characteristic impedance" of the signal lines. To maximize this shielding effect, return paths 230 are formed to have widths that extend as far as possible so to fill the space between each of signal lines 222. However, return paths do not make contact with any of signal lines 222 so that an electrical short circuit is not formed within circuitry substrate 216. As can be seen in FIGS. 2 and 3A–C, return paths 230 make contact with return plane 224 as they bend around the top edge 240 of dielectric layer 226 on front surface 218 and the back edge 242 of dielectric layer 226 on bottom surface 220. Return paths 230 can be integrally formed with return plane 224, or they can be attached to return plane 224. An alternative technique for connecting return paths 230 to return plane 224 is to have vias running through the dielectric layer rather than having return paths 230 wrap around the edges of dielectric layer 226. Vias however tend to be accompanied with their own levels of inductance and therefore reduce the performance of the electrical system. In alternative embodiments of the invention, return paths 230 only wrap around one edge of dielectric material 226 and therefore only make a single contact with return plane 224. In an alternative embodiment, there need not be return paths between every or all of signal lines 222.

Dielectric layer 226 is formed so that the top portion of return plane 224 is left exposed to form cathode pad 232. Cathode pad 232 allows photonic devices 212 to be easily mounted onto circuitry substrate 216. Photonic devices 212 have cathode contacts on the surfaces that are connected to cathode pad 232. As shown in FIGS. 2 and 3A–C, dielectric layer 226 does not extend to the side edges of return plane 224. However, in alternative embodiments, dielectric layer 226 can be formed to extend as far as return plane 224. Also, dielectric layer 226 can extend further along bottom surface 220 such that ground plane 224 is completely covered. As shown in FIGS. 2, 3A and 3C, return plane 224 extends beyond dielectric layer 226 on bottom surface 220.

Signal lines 222 are shown to fan outwards as they extend away from photonic devices 212 and anode contact pads 236. They extend outwards such that each of contact pads 206 separated from each other by a distance greater than the distance between each of anode contact pads 236. This fanned-out configuration increases the ability to shield each of signal lines 222 from each other since the distance between each of the lines is increased. The greater distance between each signal line allows the width of return paths 230 to also increase. The greater distance between each of contact pads 206 on bottom surface 220 also allows greater room for forming contacts with up-linking contacts 204 on CSA 202. Specifically, more room is provided for solder ball interconnects.

As can be clearly seen in FIGS. 3B and 3C, signal lines 222 spread apart while on front surface 218 and then extend in parallel fashion on bottom surface 220. In alternative embodiments, signal lines 222 can extend outwards on bottom surface 220 just as they do on front surface 218. In other embodiments the configuration of the separating signal lines can vary. For instance, the signal lines can spread out, then come closer together, and then spread out again as they reach contact pads 206. The specific configuration of signal lines 222 and return paths 230 will depend upon specific implementation requirements.

The number of signal lines 222 on circuitry substrate 216 depends upon the number of anode connections from photonic devices 212 that are required. Anode pads 236 should be formed in close proximity to cathode pad area 232 so to minimize the connection length between anode contacts 234 on photonic devices 212 and anode contact pads 236. Minimizing the length of such connections tends to improve electrical performance because, for example, electrical parasitics are reduced. The number of signal lines 222 also determines the number of contact pads 206 are present on bottom surface 220 of backing block 214. The number of contact pads 206 can match the number of up-linking contacts 204 are present on the top surface of CSA 202. However, the number of contact pads 206 and up-linking contacts 204 need not match. The positional arrangement of contacts 206 can be adjusted to fit the arrangement of up-linking contacts 204 on CSA 202.

The width of return paths 230 can also vary depending upon implementation requirements. In some embodiments, return paths 230 may not extend all the way out to the border of adjacent signal lines 222.

Since dielectric material layer 226 is substantially a flat sheet, return paths 230 and signal lines 222 lie substantially within a single plane. Return paths 230 are positioned in between and are coplanar with signal lines 222 and therefore effective shield adjacent signal lines 222 from each other. As stated before, this configuration is useful for reducing cross-talk.

The layers of conductive material forming return paths 230, signal lines 222, and return plane 224 can be made of materials such as gold and nickel. For example, most of these structures can be made of nickel while gold can be used to plate the areas that make electrical interconnections. For example, cathode pad area 232, anode contact pads 236, and contact pads 206 can be coated with a layer of gold. Other suitable conductive materials having high conductivity characteristics and which are suitable for manufacturing process for producing this OSA can be used.

Photonic devices 212 are such that the active areas 244 are on a surface that is opposite from its cathode contact surface. This type of photonic device is referred to as a vertically configured photonic device 212. The number of active areas 244 within each photonic device 212 and the number of photonic devices placed within cathode pad areas 232 can vary. For instance, a single photonic device 212 with multiple active areas can be attached to cathode pad area 232. In an alternative embodiment more than two photonic devices 212 with a single active area each can be attached to cathode pad area 232.

Both of photonic devices 212 are either parallel arrays of receivers or transmitters. All of the receivers or transmitters can be connected to the same return plane 224 since the same voltage is applied to each device.

The configuration of circuitry substrate 216 provides the advantages of less cross-talk, reduced parasitics, reduced ground-bounce effect, and it makes it easier to control the impedance levels. In one embodiment, total cross-talk of the order of 7% can be obtained on a 12-channel module (12 emitters or detectors) at 3.125 Gbps data transmission frequency. Various electrical performance characteristics can be achieved by adjusting the spacing of signal lines 222, the width of return paths 230, and the thicknesses of all of the components of circuitry substrate 216.

Figure 4A:
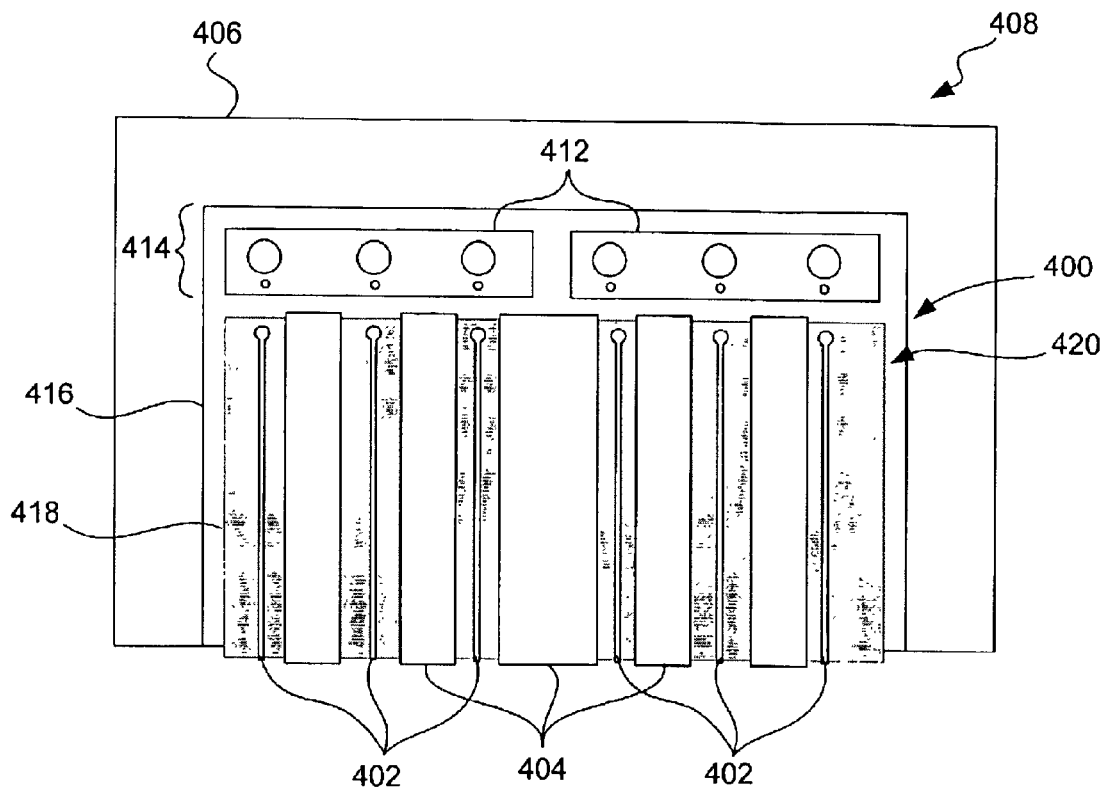
FIGS. 4A and 4B illustrate an alternative embodiment of a circuitry substrate according to an alternative embodiment of the present invention.
Figure 4B:
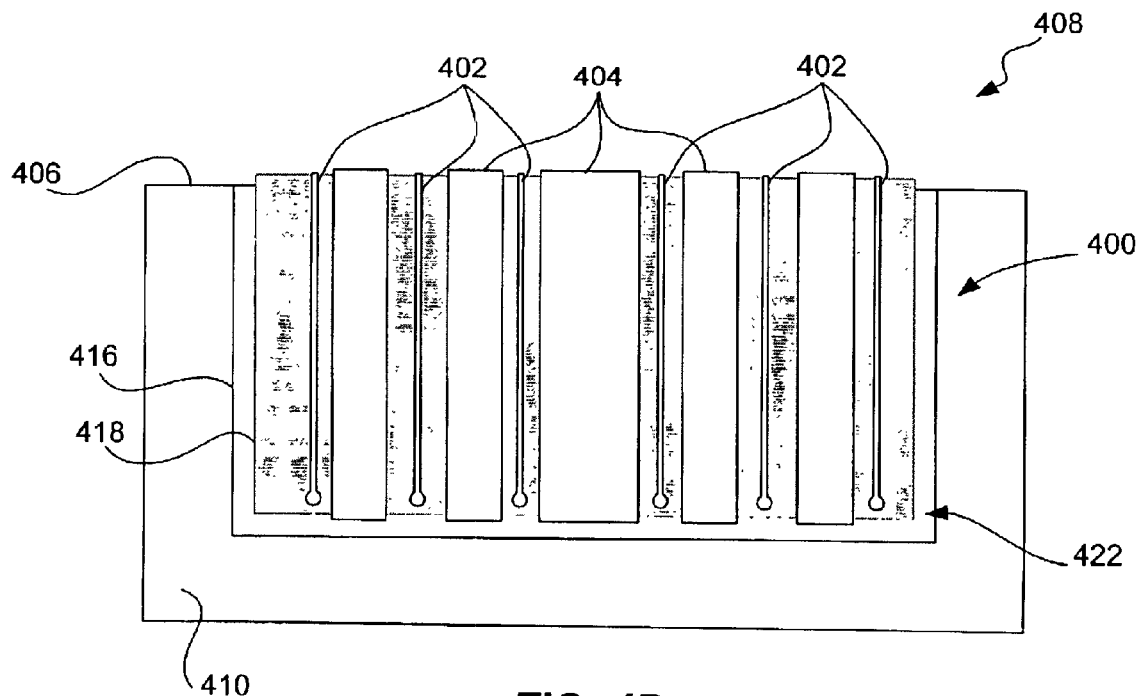

FIGS. 4A and 4B illustrate an alternative embodiment of a circuitry substrate 400 according to an alternative embodiment of the present invention. The main difference between circuitry substrate 400 of FIGS. 4A and 4B with circuitry substrate 216 of FIGS. 2 and 3A–C is that signal lines 402 and return paths 404 of FIGS. 4A and 4B remain equidistant from each other throughout the substrate. FIG. 4A illustrates a plan view of circuitry substrate 400 on a front face 406 of an optical subassembly 408. FIG. 4B illustrates a plan view of circuitry substrate 400 on a bottom face 410 of optical subassembly 408.

As seen in FIG. 4A, two photonic devices 412 are mounted onto the cathode pad area 414 of return plane 416. Dielectric layer 418 is attached to the surface of return plane 416 and signal lines 402 and return paths 404 are formed on top of dielectric layer 418. Return paths 404 wrap around top edge 420 of dielectric layer 418 to make contact with return plane 416. As seen in FIG. 4B, return paths 404 wrap around back edge 422 of dielectric layer 418 to make contact with return plane 416.

FIGS. 5A–D illustrate one embodiment of a circuitry substrate 500 with size dimension markings according to one embodiment of the present invention. FIG. 5A presents a plan view of circuitry substrate 500 on a front surface 502 of backing block 504. FIG. 5B presents a plan view of circuitry substrate 500 on a bottom surface 506 of backing block 504. FIG. 5C presents a perspective view of backing block 504 and circuitry substrate 500. FIG. 5D illustrates a magnified view of the encircled area from FIG. 5A. The dimensions shown for circuitry substrate 500 are in millimeters. The thickness of dielectric layer 512 can be in the range of approximately 5–25 microns.

As seen in FIG. 5A, return paths 508 separate adjacent signal lines 510 and have widths that extend out to each of signal lines 510. Note that there is no contact between signal lines 510 and return paths 508. Dielectric layer 512 lies beneath signal lines 510 and return paths 508. As seen in FIGS. 5B and 5C, contact pads 514 are formed at the end of signal lines 510 and return path contact pads 516 are formed at the back edge of return paths 508. Anode contact pads 518 are formed at the end of signal lines 510 near cathode pad area 520. Return paths 508 wrap around the edges of dielectric layer 512 near cathode pad area 520 and on bottom face 506 of backing block 504.

Figure 6A:
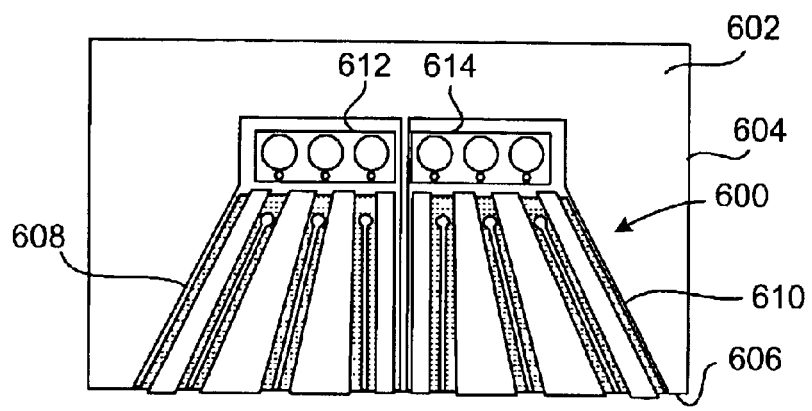
FIGS. 6A and 6B illustrate a circuitry substrate in a front plan view that looks onto a front surface of a backing block and a bottom plan view that looks onto a bottom surface of a backing block, respectively, according to an alternative embodiment of the present invention.
Figure 6B:
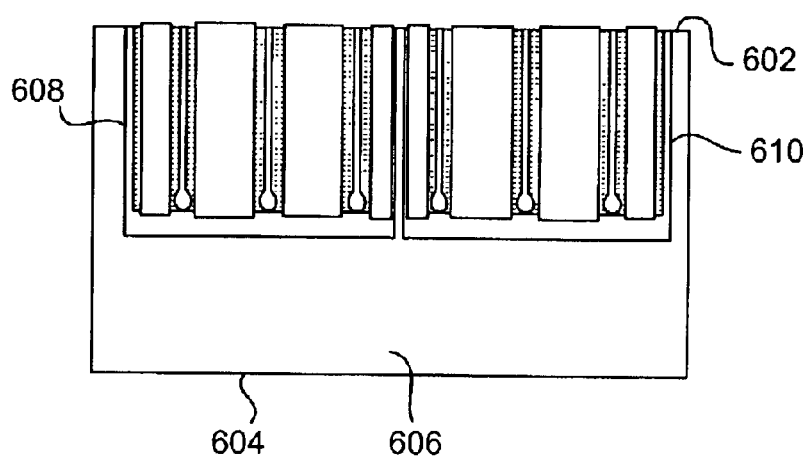

FIGS. 6A and 6B illustrate a circuitry substrate 600 in a front plan view that looks onto a front surface 602 of backing block 604 and a bottom plan view that looks onto a bottom surface 606 of backing block 604, respectively, according to an alternative embodiment of the present invention. Circuitry substrate 600 is actually split into to two circuitry substrate halves 608 and 610. Each circuitry substrate half 608 and 610 has its own sets of return layers, signal lines, and return paths as described in the other embodiments. Circuitry substrate halves 608 and 610 are disconnected from each other. In this way, different voltages can be applied to the return layers, signal lines, and return paths, and therefore to photonic devices 612 and 614 which are attached to each substrate half 608 and 610. In other words, a optical receiving device can be attached to circuitry substrate half 608 and an optical transmitter can be attached to circuitry substrate half 610. As it is commonly know, many receivers and transmitters require different levels of voltage.

For example, photonic device 612 can contain an array of light emitting devices and photonic device 614 can contain an array of optical detectors. The combination of laser emitters and detectors on the OSA makes an optoelectronic device a transceiver. For instance a 4-channel transceiver may be formed of one 1×4 laser emitter array and one 1×4 detector array. However, in alternative embodiments, both of photonic devices 612 and 614 can be laser emitters thereby making the module a transmitter. In another embodiment, both of photonic devices 612 and 614 are light detecting arrays thereby making an optoelectronic device a receiving device.

The circuitry substrate of the present invention can be manufactured to various size and performance specifications and therefore is suitable for use with many different connectors and systems. For instance, the circuitry substrate is compatible with an MPO connector, which is a standard connector that carries a 12-fiber ribbon. The circuitry substrate of the invention can be used in various applications for connecting two electrical systems. Again, the circuitry substrate can advantageously be used with systems that are very small because of its electrical performance.

In another alternative embodiment of the present invention, a circuitry substrate can include multiple sets of return planes, dielectric layers, signal lines, and return paths, which are stacked upon each other in a repeating pattern. In other words, this circuitry substrate includes two or more circuitry substrates 216 as shown in FIG. 2A wherein each substrate 216 is stacked on top of each other. This would provide for increased signal capacity and electrical performance of an optical subassembly. Each set of circuitry substrates 216 should be electrically separated from each other, for example, with a dielectric material layer.

While this invention has been described in terms of several preferred embodiments, there are alteration, permutations, and equivalents, which fall within the scope of this invention. It should also be noted that there are many alternative ways of implementing the methods and apparatuses of the present invention. It is therefore intended that the following appended claims be interpreted as including all such alterations, permutations, and equivalents as fall within the true spirit and scope of the present invention.

We claim:

1. A circuitry substrate comprising:
    a conductive return plane having a device attachment area;
    a dielectric layer having a top and a bottom surface, the bottom surface being attached to the return plane, wherein the dielectric layer does not cover the device attachment area;
    a plurality of signal lines formed on the top surface of the dielectric layer;
    a plurality of return paths formed on the top surface of the dielectric layer, each of the return paths wrapping around at least one perimeter edge of the dielectric layer and making contact with the return plane;
    a photonic device that is attached directly to the device attachment area; and
    a plurality of interconnecting wires that connect anode contact pads on photonic device to respective signal lines on the circuitry substrate;

wherein at least one return path extends between each adjacent pair of signal lines, whereby the return paths electrically shield each adjacent pair of signal lines from each other.

2. A circuitry substrate as recited in claim 1 wherein dielectric layer has a top edge that borders the device attachment area and a back edge that is opposite to the top edge, wherein the signal lines and return paths extend from a region proximate to the top edge to a region proximate to the back edge.

3. A circuitry substrate as recited in claim 2 wherein at least one of the return paths wraps around the top edge of dielectric layer and makes contact with conductive return plane.

4. A circuitry substrate as recited in claim 2 wherein at least one of the return paths wraps around the back edge of dielectric layer and makes contact with conductive return plane.

5. A circuitry substrate as recited in claim 4 wherein all of the return paths wrap around both the top edge and the back edge of the dielectric layer to make contact with the conductive return plane.

6. A circuitry substrate as recited in claim 2 wherein each of the return paths that is between a pair of adjacent signal lines has a width that expands out to the surrounding signal lines, wherein the return paths do not make contact with the signal lines.

7. A circuitry substrate as recited in claim 2 wherein the distance between at least two of the signal lines increases as the signal lines extend away from device attachment area.

8. A circuitry substrate as recited in claim 7 wherein the width of the return paths expand out to the surrounding signal lines, wherein the return paths do not make contact with the signal lines.

9. A circuitry substrate as recited in claim 1 wherein the signal lines and return paths on the top surface of dielectric layer are coplanar.

10. A circuitry substrate as recited in claim 1 further comprising:
a backing block having a front surface and a bottom surface, wherein circuitry substrate is attached to both the front and bottom surface of backing block by placing the return plane in contact with the backing block.

11. A circuitry substrate as recited in claim 10 further comprising:
a semiconductor chip package having a top surface that has exposed up-linking contacts, wherein the backing block and circuitry substrate are placed onto the top surface of the semiconductor chip package such that the signal lines of circuitry substrate are placed in electrical communication with the up-linking contacts of the semiconductor chip package.

12. A circuitry substrate as recited in claim 11 wherein semiconductor chip package is a leadless leadframe package.

13. A circuitry substrate as recited in claim 1 wherein the dielectric layer has a thickness that is approximately in the range of 5–25 microns.

14. A circuitry substrate comprising:
a conductive return plane having a device attachment area;
a dielectric layer having a top surface, a bottom surface, a top edge that borders the device attachment area, and a back edge that is opposite to the top edge, wherein the bottom surface is attached to the return plane and wherein the dielectric layer does not cover the device attachment area;
a plurality of signal lines formed on the top surface of the dielectric layer;
plurality of return paths formed on the top surface of the dielectric layer, each of the return paths wrapping around the top edge of the dielectric layer and making contact with the return plane, wherein the signal lines and return paths extend from a region proximate to the top edge to a region proximate to the back edge of the dielectric layer;
a photonic device that is attached directly to the device attachment area; and
a plurality of interconnecting wires that connect anode contact pads on photonic device to respective signal lines on the circuitry substrate;
wherein at least one return path extends between each adjacent pair of signal lines, whereby the return paths electrically shield each adjacent pair of signal lines from each other.

15. A circuitry substrate as recited in claim 14 wherein at least one of the return paths also wraps around the back edge of dielectric layer and makes contact with the conductive return plane.

16. A circuitry substrate as recited in claim 14 wherein each of the return paths that is between a pair of adjacent signal lines has a width that expands out to the surrounding signal lines, wherein the return paths do not make contact with the signal lines.

17. A circuitry substrate as recited in claim 14 wherein the distance between at least two of the signal lines increases as the signal lines extend away from device attachment area.

18. A circuitry substrate comprising:
a conductive return plane having a device attachment area;
a sheet of dielectric material having a top surface and an opposing bottom surface, a top edge that borders the device attachment area, and a back edge that is opposite to the top edge, wherein the bottom surface is attached to the return plane and wherein the dielectric layer does not cover the device attachment area;
a plurality of signal lines formed on the top surface of the dielectric layer;
a plurality of return paths formed on the top surface of the dielectric layer such that the sheet of dielectric material is sandwiched between the return plane on the bottom surface and the plurality of signal lines and return paths on the top surface, each of the return paths wrapping around the top edge and the back edge of the dielectric layer and making contact with the return plane, wherein the signal lines and return paths extend from a region proximate to the top edge to a region proximate to the back edge of the dielectric layer;
a photonic device that is attached directly to the device attachment area; and
a plurality of interconnecting wires that connect anode contact pads on photonic device to respective signal lines on the circuitry substrate;
wherein at least one return path extends between each adjacent pair of signal lines, whereby the return paths electrically shield each adjacent pair of signal lines from each other.

* * * * *